United States Patent [19]
Abbott

[11] Patent Number: 6,031,315
[45] Date of Patent: Feb. 29, 2000

[54] OPTIMAL CUT FOR SAW DEVICES ON QUARTZ

[75] Inventor: Benjamin P. Abbott, Orlando, Fla.

[73] Assignee: Sawtek Inc., Orlando, Fla.

[21] Appl. No.: 09/115,431

[22] Filed: Jul. 15, 1998

Related U.S. Application Data

[60] Provisional application No. 60/052,658, Jun. 16, 1997.

[51] Int. Cl.[7] ................................................. H03H 9/02
[52] U.S. Cl. .................... 310/313 A; 310/313 R; 310/313 B; 310/361
[58] Field of Search ................. 310/313 R, 313 A, 310/313 B, 361

[56] References Cited

U.S. PATENT DOCUMENTS

| | | |
|---|---|---|
| 3,956,646 | 5/1976 | Shibayama et al. . |
| 3,987,377 | 10/1976 | Kuroda et al. . |
| 4,220,888 | 9/1980 | Gagnepain et al. . |
| 4,232,240 | 11/1980 | O'Connell . |
| 4,323,809 | 4/1982 | O'Connell ............... 310/313 A |
| 4,472,656 | 9/1984 | Franx . |
| 4,484,098 | 11/1984 | Cullen et al. . |
| 4,489,250 | 12/1984 | Ebata et al. . |
| 4,499,395 | 2/1985 | Kahan . |
| 4,511,817 | 4/1985 | Chai et al. . |
| 4,670,680 | 6/1987 | Andle ........................ 310/313 A |
| 4,670,681 | 6/1987 | Wright et al. . |
| 5,420,472 | 5/1995 | Cho et al. ................... 310/313 R |
| 5,773,911 | 6/1998 | Tanaka et al. ............. 310/313 A |
| 5,831,492 | 11/1998 | Solie . |
| 5,895,996 | 4/1999 | Takagi et al. .............. 310/313 A |
| 5,953,433 | 9/1999 | Fujimoto et al. .......... 310/313 R |

FOREIGN PATENT DOCUMENTS

| | | | |
|---|---|---|---|
| 0 860 943 | 8/1998 | European Pat. Off. ......... H03H 9/02 |
| WO 97/10646 | 3/1997 | WIPO . | |
| WO 99/04488 | 1/1999 | WIPO ............................ H03H 9/02 |

*Primary Examiner*—Thomas M. Dougherty
*Attorney, Agent, or Firm*—Allen, Dyer, Doppelt, Milbrath & Gilchrist, P.A. Attorneys at Law

[57] ABSTRACT

A quartz single crystal substrate (12), includes a prescribed range of Euler angles for substrate and crystal orientation which improves signal processing for surface acoustic wave (SAW) devices (10). When a voltage is applied to an input inter digital transducer (IDT) (16) of the SAW device (10), a surface acoustic wave is generated in the quartz substrate (12). The surface acoustic wave propagates in a direction generally perpendicular to electrodes (20) of the IDT (16). The quartz crystal cut and wave propagation directions are defined to reduce the adverse effects of diffraction on SAW devices (10). As a result, frequency response distortions and insertion loss increases due to diffraction are reduced while maintaining good temperature stability and a low power flow angle.

9 Claims, 5 Drawing Sheets

OPTIMAL CUT FOR SAW DEVICES ON QUARTZ

RELATED APPLICATIONS

This Application is related to Provisional Application having Ser. No. 60/052,658, filed on Jul. 16, 1997 in the United States Patent and Trademark Office for An Optimal Cut For SAW Devices On Quartz, commonly owned with the instant application.

FIELD OF THE INVENTION

The invention relates to a surface acoustic wave (SAW) device and, more particularly, to a device having a quartz crystal substrate with a predetermined crystalline orientation for causing a surface acoustic wave to propagate along a predetermined crystalline axis of the substrate.

BACKGROUND

The invention relates to a surface acoustic wave (SAW) device and, more specifically, to a device having a quartz crystal substrate with a predetermined crystalline orientation for causing a surface acoustic wave to propagate along a predetermined crystalline axis of the substrate.

This invention relates to an optimal surface acoustic wave orientation on single crystal silicon dioxide or $SiO_2$, commonly referred to as quartz. By way of example, SAW devices are currently used as bandpass filters, resonators, delay lines, and convolvers, in a broad range of RF and IF applications such as wireless, cellular communication, and cable TV. Any piezoelectric crystal may be used to produce substrates for the construction of SAW devices. However, three piezoelectric crystals have become dominant in the SAW industry. They are lithium niobate, lithium tantalate, and quartz. There are several material properties that determine the usefulness of any particular substrate. These properties include: (1) SAW velocity, $V_{SAW}$; (2) SAW piezoelectric coupling coefficient, $k^2$; (3) power flow angle, PFA; (4) diffraction or beam spreading coefficient, gamma ($\gamma$); and (5) temperature coefficient of delay, TCD. It is rare to find an orientation of a crystal to produce a substrate which optimizes these properties at the same time. Therefore, the choice of the crystal and orientation depends on desirable features for the specific application, and most always involves a compromise between these SAW material properties. By way of example, a high velocity is desirable for high frequency devices, because the device geometry patterns are larger and, therefore, the devices are easier to fabricate. At low frequencies, a low velocity is usually desirable because the device size is smaller, resulting in lower device and packaging costs. Thus, there is no universally optimum velocity. Likewise, the desired value for $k^2$ is often set by the desired bandwidth of the SAW device. Large values of $k^2$ are well suited for broad bandwidth devices and lower values of $k^2$ for narrow bandwidth devices. Quartz is well suited for narrow bandwidth applications, lithium niobate for broad bandwidths, and lithium tantalate for moderate bandwidths. For most devices, particularly narrow band devices, the TCD should be as low as possible, and ideally zero. From this point of view, ST-quartz is best, lithium niobate is worst, and lithium tantalate is in between. The optimal value of gamma is −1.0, which results in minimum beam spreading. From this point of view, YZ lithium niobate is preferred as ideal, ST-quartz is worst, and lithium tantalate is in between. The PFA should be zero, and this is the case for most of the commonly used SAW substrates, with an exception being the 112 lithium tantalate, which has a PFA of 1.55 degrees. For narrow band applications, ST-quartz is the standard choice. However, narrow bandwidth SAW devices are generally constructed using long transducers, which enhance the beam spreading nature of the ST-quartz substrate. What is needed is a quartz substrate orientation that offers a TCD, $k^2$, and PFA which are essentially the same as those for ST-quartz, and at the same time a diffraction coefficient, gamma, at or near the optimal value of −1.0.

The present invention satisfies this need and provides a different orientation of quartz which has far superior properties to ST-quartz, in that, the substantial beam spreading nature of ST-quartz (gamma=+0.38) has been dramatically reduced (gamma =−1.0).

SUMMARY OF THE INVENTION

It is the object of the present invention to provide a quartz crystal orientation having a substantially planar surface defined by first, second, and third Euler angles (lambda, mu, theta also known as $\lambda, \mu,$ and $\theta$), such that SAW propagation within a range of angles on quartz is characterized by piezoelectric coupling essentially the same as ST-quartz, near zero PFA, near zero TCD, and minimum beam spreading. While these three conditions are not all met exactly for any given orientation, the performance as measured by these three conditions together is significantly better than for ST-quartz, and choices within this range can be made to favor one or two at the slight expense of the third.

One preferred embodiment of the present invention includes a device which contains a quartz substrate, on the surface of which input and output interdigital transducers (IDTs) are placed.

The surface of the quartz substrate is perpendicular to axis Z', the electrodes of the IDTs are perpendicular to axis X' and are parallel to axis Y'. Axes X', Y', and Z' are defined by Euler angles with respect to crystal axes X, Y, and Z of the quartz crystal. Using Euler angles (lambda, mu, theta), a unique substrate orientation is defined. Angle lambda is in the range from −5° to 5°; angle mu in the range from 37° to 46°; and angle theta in the range from 20° to 26°.

DETAILED DESCRIPTION OF THE PREFERRED EMBODIMENT

Figure 1:
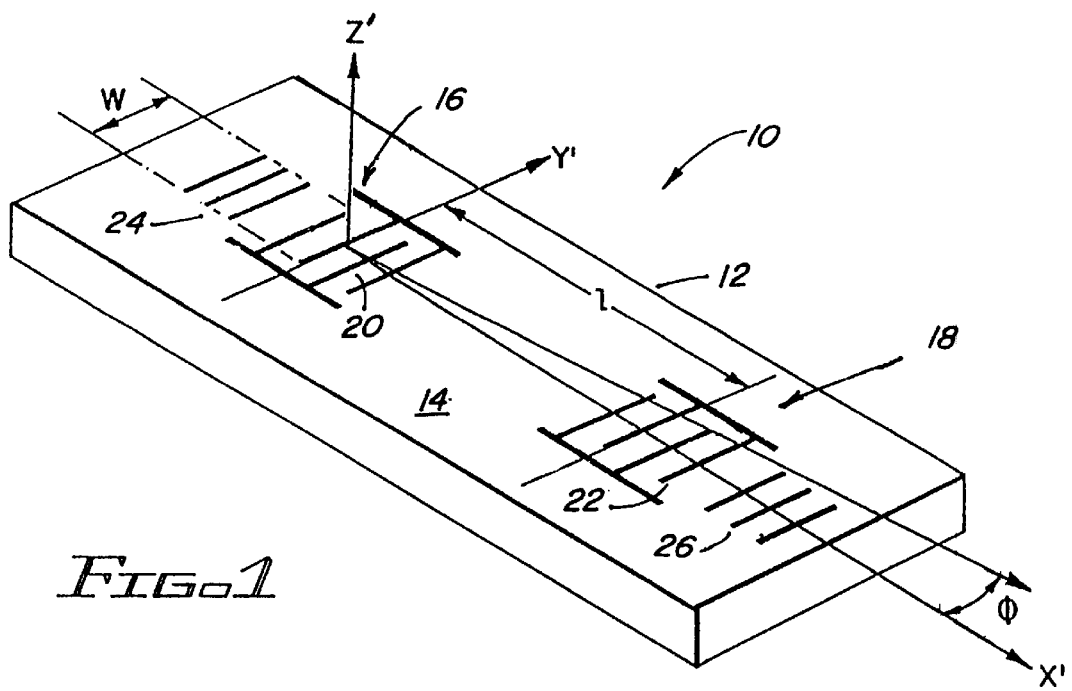
FIG. 1 is a perspective view of a SAW device illustrating interdigital transducers (IDTs) located on a quartz substrate surface, and a power flow angle, PFA Φ.

As illustrated, by way of example with reference to FIG. 1, one preferred embodiment of the present invention includes a SAW device 10 which contains a quartz substrate 12 on the surface 14 of which an input interdigital transducer 16 and an output interdigital transducer 18 (IDT) are placed.

Figure 2:
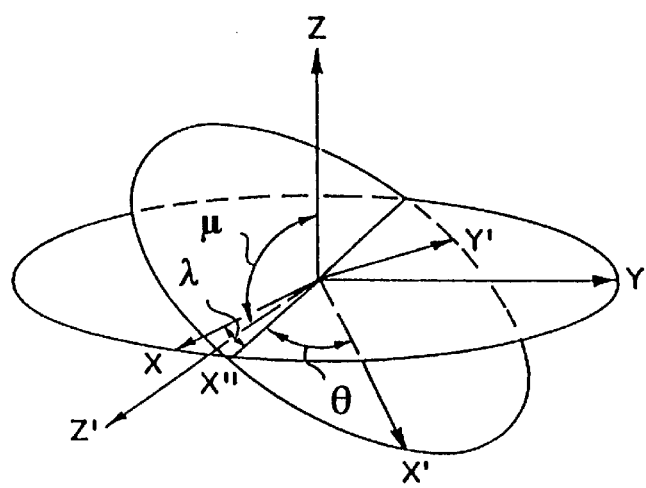
FIG. 2 diagrammatically illustrates substrate axes X', Y', and Z' and crystal axes X, Y, and Z along with first, second, and third Euler angles lambda, mu, and theta describing relative orientation of X, Y, and Z to X', Y', and Z', wherein X' is defined as a direction of SAW propagation.
Figure 2:
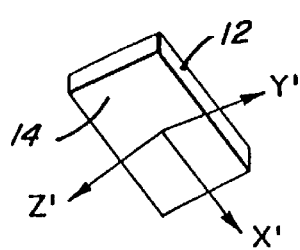

The surface 14 of the quartz substrate 12 which has been properly prepared for SAW propagation is perpendicular to axis Z', electrodes 20, 22 of IDTs 16, 18 respectively, are perpendicular to axis X' and are parallel to axis Y'. As illustrated with reference to FIG. 2, axes X', Y', and Z' are defined by Euler angles, (lambda, mu, theta), with respect to crystal axes X, Y, and Z of the quartz substrate 12. For the preferred embodiment of the present invention, angle lambda is in the range $-5°$ to $5°$; angle mu in the range $37°$ to $46°$; and angle theta in the range $20°$ to $26°$.

The crystal cut of quartz with Euler angles of lambda= $0°+/-5°$, mu=$41.5°+/-4.5°$, and theta=$23°+/-3°$, provide improved performance for SAW devices, such as the device 10 illustrated herein by way of example. Specifically, the crystal cut provides near simultaneous optimization of three critical SAW propagation parameters and a favorable value of a fourth parameter. This fourth parameter is the coupling constant, $k^2$, which varies between 0.15% and 0.18% as compared to 0.12% for ST-quartz crystal. The three SAW propagation parameters are the PFA, gamma, and TCD, which as earlier described, are the power flow angle, the diffraction coefficient, and the temperature coefficient of delay, respectively. PFA is also known as $\Phi$, the beam steering angle, and is the angle between the SAW wave vector, which is generally normal to the tap electrodes 20, 22 as illustrated again with reference to FIG. 1, and the direction of power flow. Ideally, the PFA would be zero. Gamma is a measure of the diffraction or beam spreading. Typically, as a SAW propagates on a substrate, the beam profile will change, and broaden. The beam spread causes diffraction loss and distortion to the SAW device's response. For isotropic materials, the value of gamma is zero, and diffraction is of moderate concern. Diffraction is minimized when gamma=$-1$, and this is the case for YZ $LiNbO_3$ and a special MDC (minimum diffraction cut) of $LiTaO_3$. For ST-quartz, gamma=$+0.38$, and diffraction is typically worse than for the isotropic case.

There is a first range of angles within the designated range of this disclosure for which gamma=$-1$; there is a second range of angles for which TCD is zero; and there is a third range of angles for which PFA is zero. For the disclosed preferred embodiment, these three ranges, or loci, do indeed intersect. However, locating the exact point of intersection is very difficult. Also, other factors may have an effect on the selection of the desired SAW parameters and thus the choice of appropriate Euler angles. For example, the TCD of a SAW device may be adversely effected by several variables. These factors include, but are not restricted to, the type and thickness of the conductive film (most commonly aluminum) used to construct the SAW device, and the method of packaging the SAW device. Thus, changes to the Euler angles may have to be made to compensate for the conductive film or packaging. Additionally, in many applications the desired TCD for the SAW device is not zero. Often, other components within a circuit or system introduce TCDs for which the SAW device must compensate. To provide compensation, a TCD equal in magnitude but opposite in polarity, is introduced in designing the SAW device. Generally, an adjustment of the SAW device's TCD in the range of $+5$ ppm/° C. to $-5$ ppm/° C. is sufficient to compensate for temperature variations of other components within the circuit, or system.

Figure 3A:
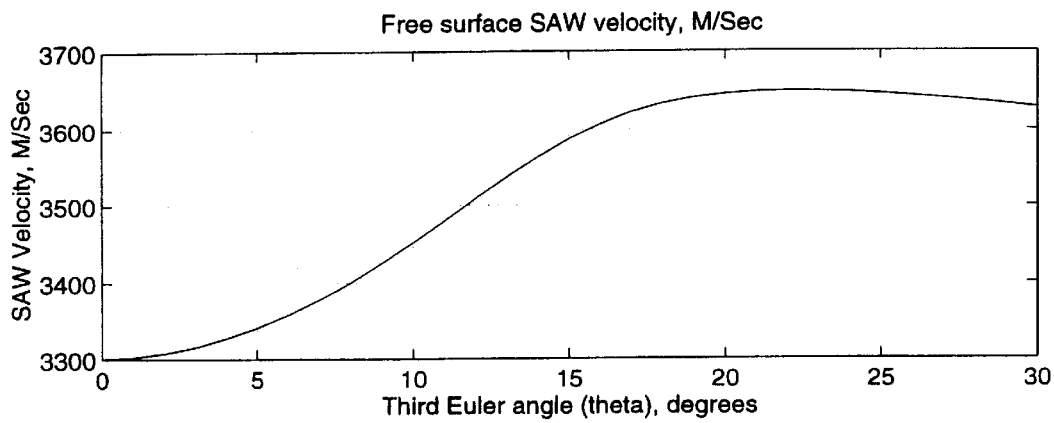
FIGS. 3A–3C illustrate the dependence of the several SAW performance parameters including SAW velocity, $k^2$, PFA, gamma, and TCD on the direction of propagation for a quartz substrate defined by the Euler angles (0°, 42°, theta), for theta between 0° and 30°.
Figure 3B:
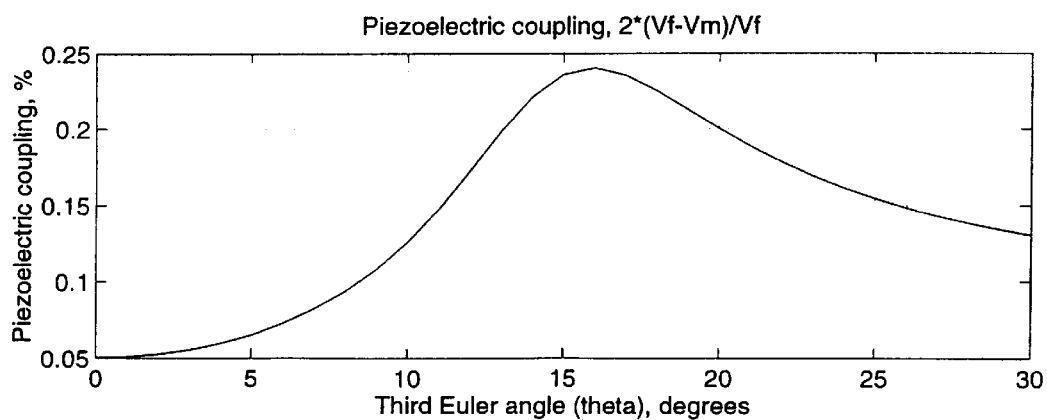
Figure 3C:
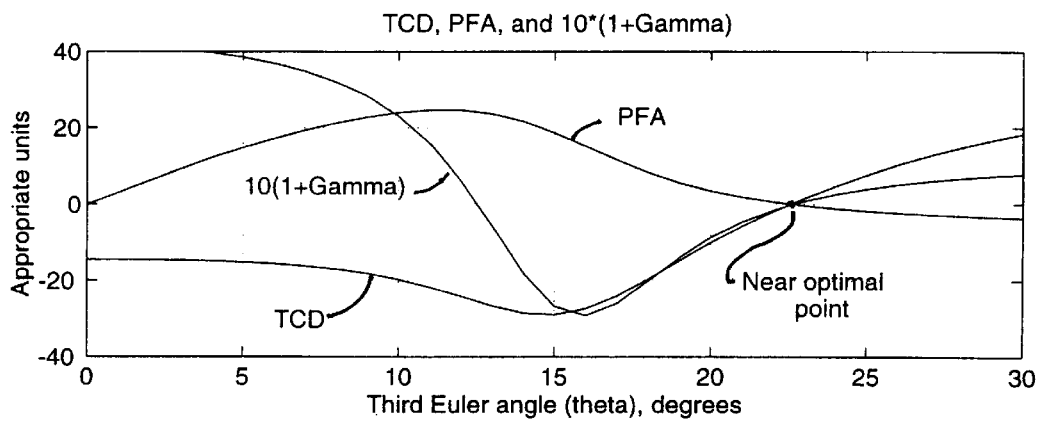

FIGS. 3A–3C illustrate the dependence of the various SAW performance parameters such as SAW velocity, $k^2$, PFA, gamma, and TCD on the direction of propagation for a quartz substrate defined by the Euler angles ($0°$, $42°$, theta), for theta ranging from $0°$ to $30°$. In FIG. 3C a near optimal point can be seen for theta approximately equal to $22.5°$. Note that the gamma data is scaled by 10 (1+gamma) for convenience in viewing PFA and TCD.

Figure 4:
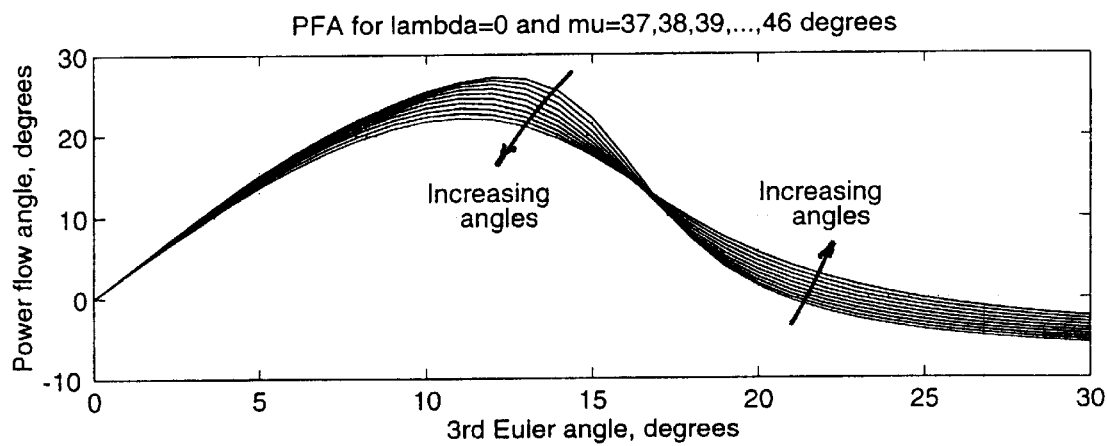
FIG. 4 illustrates the dependence of the PFA on the third Euler angle, theta in a range of 0° to 30°. The multiple curves result from varying the second Euler angle, mu, from 37° to 46° in increments of 1°.

FIG. 4 illustrates the dependence of the PFA on the third Euler angle, theta, in a range of $0°$ to $30°$. The multiple curves in FIG. 4 result from varying the second Euler angle, mu, from $37°$ to $46°$ in $1°$ increments. For each value of mu, there exists a value of theta for which the PFA is exactly zero.

Figure 5:
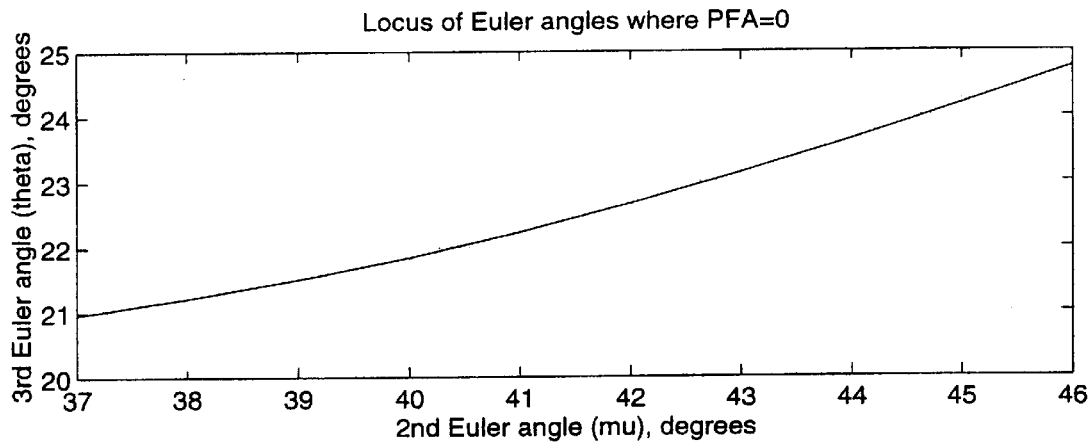
FIGS. 5 illustrates the locus of the Euler angles, corresponding to the conditions that lambda=0 and PFA=0.
Figure 6A:
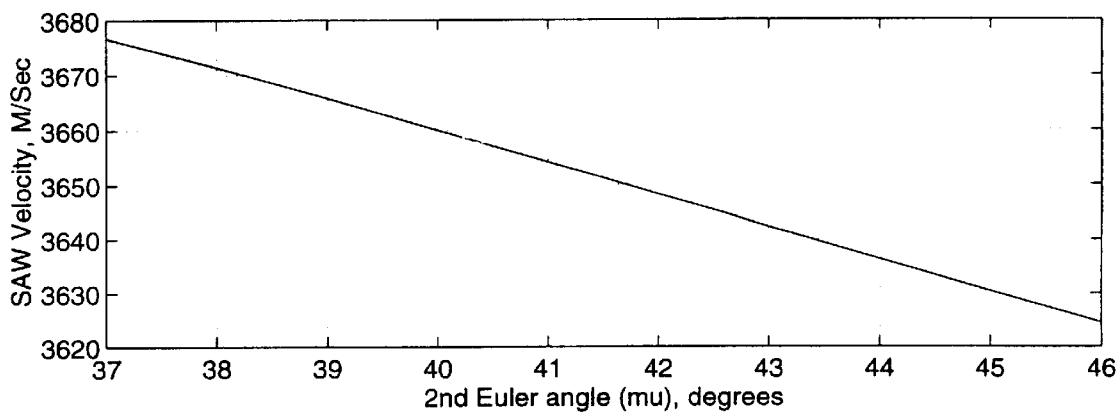
FIGS. 6A–6D illustrate the dependence of SAW performance parameters including SAW velocity, $K^2$, TCD, and gamma on the various loci of Euler angles (0, mu, theta) for which PFA=0.
Figure 6B:
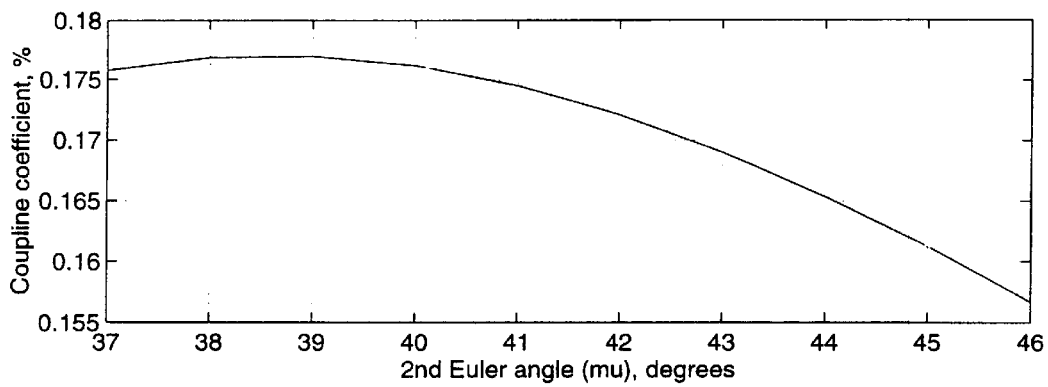
Figure 6C:
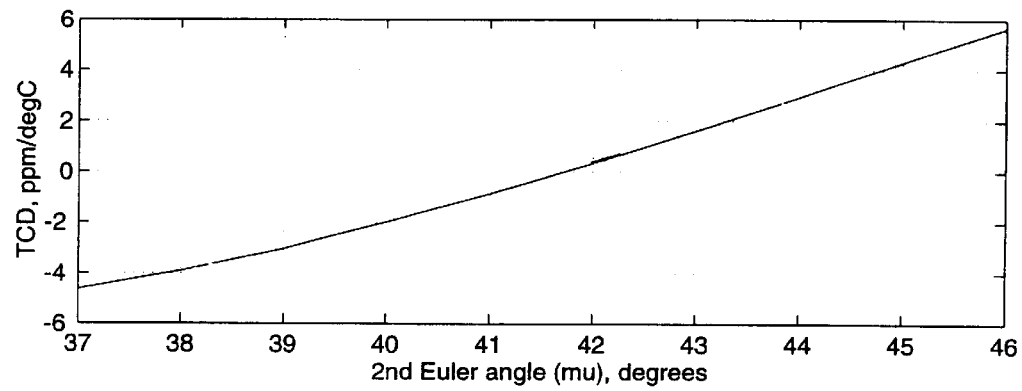
Figure 6D:
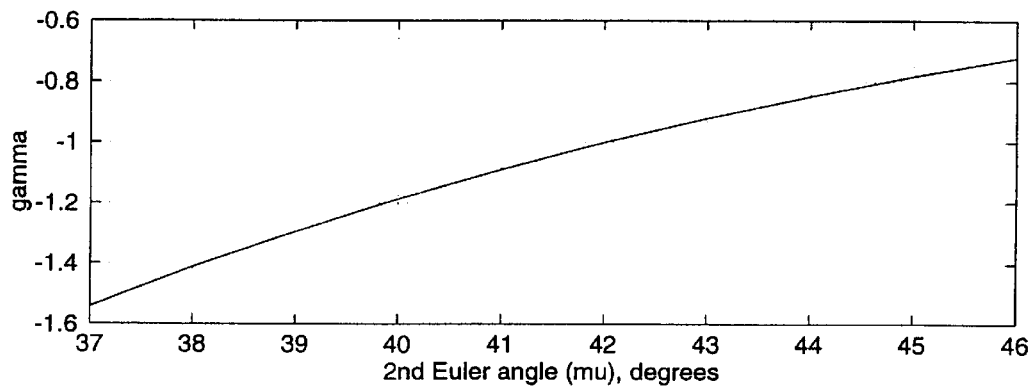

FIG. 5 illustrates the value of theta at which the PFA in FIG. 4 equals zero for mu in the range of $37°$ to $46°$. Thus, FIG. 5 illustrates the locus of the Euler angles, corresponding to the conditions that lambda=0 and PFA=0.

FIGS. 6A–6D illustrate the dependence of several SAW performance parameters (SAW velocity, $K^2$, TCD, and gamma) on the various loci of Euler angles ($0°$, mu, theta) for which lambda=$0°$ and PFA=0 (these loci are illustrated in FIG. 5). Within the designated range of this disclosure, the optimal choice of angles would be dependent upon the application, choice of TCD, or slight variations in one or more of the three parameters, TCD, PFA, or gamma. This is the reason for the spread of angles disclosed herein.

The Euler angle convention used is as described by Slobodnik et al. in "Microwave Acoustic Handbook," Vol. 1, Surface Wave Velocities, AFCRL-70-0164, March 1970, Physical Sciences Research Papers, No. 414, Office of Aerospace Research, USAF.

Consider a wafer outline on a surface normal to the axis Z'. Construct a flat plane along one edge of the wafer which is normal to the axis X'. The direction of SAW propagation is parallel to the axis X'. Assume that the crystal axes X, Y, and Z are coincident with the wafer outline axes X', Y', and Z', respectively. With no rotation, the wafer is considered a Z cut (the wafer is cut with the polished surface normal to Z) and X propagating (the SAW propagates in a direction parallel to the X axis). With any subsequent rotation, the wafer axes X', Y', and Z' are rotated, and the crystal axes X, Y, and Z are assumed to be fixed. By way of example, consider the Euler angles (lambda, mu, theta)=($0°$, $45°$, $24°$), which is a case within the disclosed range. The first rotation would rotate around Z' (X' toward Y') by $0°$. Since lambda=$0°$, there is no rotation for this case. The next rotation is around the "new" X', indicated as X" in FIG. 2 ( the "new" axes are always tied to the wafer so that any rotation is around a wafer axis that includes all previous rotations) by mu, which is $45°$ (Y' toward Z' for a positive angle rotation). Finally, rotate around Z' (X' toward Y') by theta, which is $24°$.

Again with reference to FIG. 1, and by way of example, one preferred embodiment of the present invention includes the SAW device 10 containing the quartz substrate 12, and IDTs 16, 18 and reflecting electrodes 24, 26. As earlier described, the axis Z' is normal to the substrate surface 14, the axis X' is normal to electrodes 20, 22, and the Y' axis is parallel to the electrodes 20, 22. These axes X', Y', and Z' are defined with respect to crystal axes as follows: lambda=$-5°$ to $5°$, mu=$37°$ to $46°$, theta=$20°$ to $26°$, where lambda, mu, and theta are the Euler angles.

With reference again to FIG. 2, lambda is the angle between crystal axis X and auxiliary axis X", which is the axis of rotation of the plane XY (up to required orientation of the substrate surface).

mu is the angle between axis Z and the normal Z' to the substrate surface 14.

theta is the angle between axis X" and axis X', and as earlier described X' is perpendicular to the electrodes 20, 22 of IDTs 16, 18, respectively.

Advantages of the device 10 as compared to earlier proposed cuts for quartz are realized. By way of example, SAW propagation parameters on ST-quartz (whose Euler angles are lambda=0°, mu=132.75°, and theta=0°) would be as follows: TCD=0, PFA=0, gamma=0.38, and $k^2$=0.12%. As illustrated by FIGS. 4, 5, and 6 for the present invention, a quartz cut may be selected whose Euler angles are within the chosen limits –5°<lambda<5°, 37°<mu<46°, and 20°<theta<26° which satisfies a TCD requirement of between –5 ppm/° C. and +5 ppm/° C. and satisfies near ideal conditions for power flow and beam spreading, PFA=0, gamma=–1, respectively. As a consequence, the beam spreading is improved without substantial and within acceptable degradation of the TCD, PFA, or $k^2$ as compared to prior works on quartz, such as ST-quartz.

Figure 7:
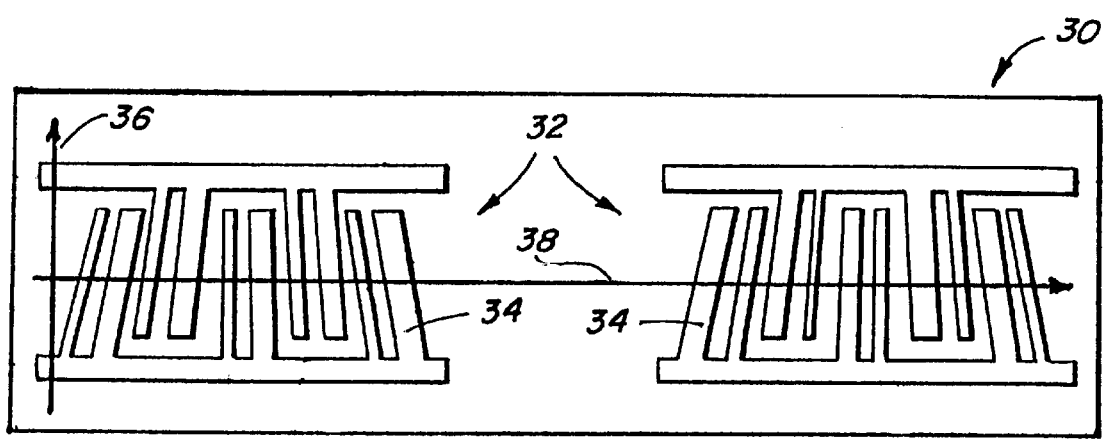
FIG. 7 is a plan view of a SAW device illustrating interdigital transducers (IDTs) in a tapered alignment located on a quartz substrate surface.

While specific embodiments of the invention have been described in detail hereinabove, it is to be understood that various modifications may be made from the specific details described herein without departing from the spirit and scope of the invention. By way of example, the above described propagation parameters are particularly advantageous for application to tapered SAW devices 30 as illustrated with reference to FIG. 7. The SAW device 30 includes tapered transducers 32 having interdital electrodes 34. The electrodes 34 have a tapered alignment, wherein the periodicity of electrodes 34 changes along a direction 36 generally orthogonal to an acoustic wave axis of propagation 38 through the transducer. The axis of propagation 38 is defined by the crystal orientation Euler angle theta.

The present invention has been described with a right handed coordinate system for a right handed quartz crystal. It is understood that alternate embodiments and systems fall within the scope of the description and claims.

What is claimed is:

1. A surface acoustic wave (SAW) device comprising:
    a quartz substrate having a SAW propagation surface; and
    at least one interdigital transducer having electrodes on the surface for launching and/or detecting surface acoustic waves, wherein a surface wave direction of propagation is along an X' axis, the substrate further having an Z' axis normal to the surface, and a Y' axis along the surface and perpendicular to the X' axis, the quartz substrate further having a crystal orientation defined by crystal axes X,Y, and Z, the relative orientation of device axes X', Y', and Z' being defined by Euler angles lambda, mu, and theta, wherein lambda has a value ranging from –5° to 5°, mu has a value ranging from 37° to 46°, and theta has a value ranging from 20° to 26°.

2. The device according to claim 1, wherein the interdigital electrodes have an orientation generally perpendicular to a direction of wave propagation generally defined by the crystal orientation Euler angle theta.

3. The device according to claim 1, wherein the interdital electrodes have a tapered alignment, and wherein the periodicity of electrodes changes along a direction generally orthogonal to an acoustic wave axis of propagation through the transducer, the direction defined by the crystal orientation Euler angle theta.

4. A surface acoustic wave substrate formed from a quartz single crystal, the substrate comprising a crystal orientation cut for forming a planar surface, the crystal orientation defined by Euler angles lambda and mu, wherein lambda has a value ranging from approximately –5° to approximately 5°, and mu has a value ranging from approximately 37° to 46°.

5. A method for forming a surface acoustic wave device comprising the steps of:
    providing a silicon dioxide (quartz) single crystal;
    orientating the crystal for cutting a planar surface, the crystal orientation defined by Euler angles lambda, mu, and theta;
    cutting the crystal for forming the planar surface, the cut defined by the Euler angles lambda, mu, and theta, wherein lambda has a value ranging from approximately –5° to approximately 5°, mu has a value ranging from approximately 37° to 46°, and theta has a value ranging from approximately 20° to 26°;
    preparing the planar surface for affixing a transducer thereon; and
    affixing an interdigitized transducer on the planar surface for propagating and detecting surface acoustic waves propagating in a direction generally along an axis of propagation defined by the crystal orientation angle theta.

6. The method according to claim 5, wherein the transducer affixing step comprises the step of orientating electrodes of the transducer generally perpendicular to the axis of propagation.

7. The method according to claim 5, wherein the transducer affixing step comprises the step of orientating electrodes in a tapered alignment, wherein the periodicity of electrodes changes along a direction generally orthogonal to an acoustic wave axis of propagation through the transducer, the direction defined by the crystal orientation Euler angle theta.

8. A method for forming silicon dioxide (quartz) single crystal substrate comprising the steps of:
    orientating the quartz crystal for cutting a planar surface, the crystal orientating defined by Euler angles lambda and mu; and
    cutting the crystal for forming the planar surface, the cut defined by the Euler angles lambda and mu, wherein lambda has a value ranging from approximately –5° to approximately 5° and mu has a value ranging from approximately 37° to 46°.

9. A method for generally improving piezoelectric coupling, power flow angle, and diffraction in a surface acoustic wave device, the method comprising the steps of:
    providing a silicon dioxide (quartz) single crystal;
    orientating the quartz crystal for cutting a planar surface, the crystal orientating defined by Euler angles, wherein lambda has a value ranging from approximately –5° to approximately 5°, mu has a value ranging from approximately 37° to 46°, and theta has a value ranging from approximately 20° to 26°; and
    affixing interdigitized transducers on the planar surface for propagating and detecting surface acoustic waves in a direction generally along an axis of propagation defined by the crystal orientation angle theta.

* * * * *